United States Patent
Van Aert et al.

(10) Patent No.: US 10,096,732 B2
(45) Date of Patent: *Oct. 9, 2018

(54) BACKSHEET FOR PHOTOVOLTAIC MODULES

(71) Applicant: AGFA GEVAERT, Mortsel (BE)

(72) Inventors: Hubertus Van Aert, Mortsel (BE); Ijya Srivastava, Mortsel (BE); Frank Vangaever, Mortsel (BE)

(73) Assignee: AGFA-GEVAERT, Mortsel (BE)

( * ) Notice: Subject to any disclaimer, the term of this patent is extended or adjusted under 35 U.S.C. 154(b) by 365 days.

This patent is subject to a terminal disclaimer.

(21) Appl. No.: 14/892,097

(22) PCT Filed: Jun. 26, 2014

(86) PCT No.: PCT/EP2014/063495
§ 371 (c)(1),
(2) Date: Nov. 18, 2015

(87) PCT Pub. No.: WO2015/003915
PCT Pub. Date: Jan. 15, 2015

(65) Prior Publication Data
US 2016/0118518 A1     Apr. 28, 2016

(30) Foreign Application Priority Data
Jul. 9, 2013     (EP) ..................... 13175703

(51) Int. Cl.
| | |
|---|---|
| H01L 31/00 | (2006.01) |
| B05D 5/12 | (2006.01) |
| H01L 31/049 | (2014.01) |
| C08G 18/50 | (2006.01) |
| C08G 18/22 | (2006.01) |
| C08G 18/24 | (2006.01) |
| H01L 31/18 | (2006.01) |

(52) U.S. Cl.
CPC .......... *H01L 31/049* (2014.12); *C08G 18/227* (2013.01); *C08G 18/24* (2013.01); *C08G 18/5015* (2013.01); *H01L 31/18* (2013.01); *Y02E 10/50* (2013.01)

(58) Field of Classification Search
CPC ....... H01L 31/18; H01L 31/049; C08G 18/24; C08G 18/5015; C08G 18/227; Y02E 10/50
USPC ............................................. 136/259; 427/74
See application file for complete search history.

(56) References Cited

U.S. PATENT DOCUMENTS

| | | | |
|---|---|---|---|
| 2009/0151774 A1 | 6/2009 | Depine et al. | |
| 2012/0048352 A1* | 3/2012 | Nagato | C08G 18/6279 136/251 |
| 2015/0318423 A1* | 11/2015 | Vangaever | C08J 7/04 136/256 |

FOREIGN PATENT DOCUMENTS

| | | |
|---|---|---|
| EP | 0 102 720 A1 | 3/1984 |
| EP | 2 468 829 A1 | 6/2012 |
| EP | 2 746 322 A1 | 6/2014 |

OTHER PUBLICATIONS

Official Communication issued in International Patent Application No. PCT/EP2014/063495, dated Sep. 1, 2014.

* cited by examiner

*Primary Examiner* — William K Cheung
(74) *Attorney, Agent, or Firm* — Keating and Bennett, LLP (57) ABSTRACT

A backsheet for a photovoltaic module includes a support and a weather resistant layer, the weather resistant layer including a binder containing a crosslinkable group, an isocyanate crosslinking agent, and a catalyst that improves the crosslinking of the binder, wherein the catalyst is a zinc based catalyst or a bismuth based catalyst.

14 Claims, 2 Drawing Sheets

A schematic representation of an embodiment of a photovoltaic module.

FIGURE 1: A schematic representation of an embodiment of a photovoltaic module.

FIGURE 2: A schematic represenation of an embodiment of a back sheet.

FIGURE 3: A schematic representation of an embodiment of an "integrated" back sheet.

BACKSHEET FOR PHOTOVOLTAIC MODULES

CROSS-REFERENCE TO RELATED APPLICATIONS

This application is a 371 National Stage Application of PCT/EP2014/063495, filed Jun. 26, 2014. This application claims the benefit of European Application No. 13175703.1, filed Jul. 9, 2013, which is incorporated by reference herein in its entirety.

BACKGROUND OF THE INVENTION

1. Field of the Invention

The invention relates to a backsheet for a photovoltaic module and to a method to prepare such a backsheet.

2. Description of the Related Art

With increasing energy prices and increasing concern over the scarcity and the environmental impact of hydrocarbon fuels, industry is turning to alternative energy sources, such as solar energy.

Photovoltaic (PV) modules, also known as solar modules, are used to produce electrical energy from sunlight. Such modules are based on a variety of semiconductor cell systems (the solar cell) that can absorb light and convert it into electrical energy.

In a typical PV module, the solar cell arrays are positioned between two encapsulant layers, which are further positioned between a frontsheet (upper side of the module facing the incoming light) and a backsheet (back side of the module). The most widely used encapsulant is EVA, i.e. Ethylene Vinyl Acetate.

The backsheet provides weather resistance, UV resistance, moisture barrier properties, low dielectric constant and a high breakdown voltage to the solar cell module. To provide such properties to the PV module, a backsheet comprises a weather resistant film, for example a Tedlar™ film, and/or a polyethyleneterephthalate (PET) film. For example a TPT type backsheet, wherein a Tedlar™ film is laminated on both sides of a PET film, or a TPE type backsheet, wherein a Tedlar™ is laminated on one side of a PET film, while on the other side an encapsulant adhesion layer is provided, are nowadays widely used as backsheet on the market.

Instead of laminating a weather resistant sheet on a support it may be advantageous to coat a weather resistant layer on a support, for example to decrease the cost price of the backsheet. Such a weather resistant layer may be coated from an aqueous or a non-aqueous coating solution. US2009/0151774 for example discloses a backsheet wherein the weather resistant layer is coated on a plastic support instead of laminated.

Typically, the coated layer has to be cured to obtain the necessary weather resistant properties. The curing efficiency may also determine the coating speed of the weather resistant layer, as the coated layer has to be "dry" enough at the end of the coating process to avoid "sticking" when the backsheet is stored on roll.

SUMMARY OF THE INVENTION

Preferred embodiments of the present invention provide a backsheet for a PV module, wherein the backsheet, while providing sufficient or even improved weather resistance, UV resistance and moisture barrier properties to the PV module, can be produced more efficiently and cost effective.

The advantages and benefits realized by the backsheet are defined below. It has been found that the presence of Zn or Bi based catalysts on one hand improves the weather resistant properties of a backsheet and on the other hand makes them more cost effective.

Further advantages and embodiments of the present invention will become apparent from the following description and the dependent claims.

DETAILED DESCRIPTION OF THE PREFERRED EMBODIMENTS

Figure 1:
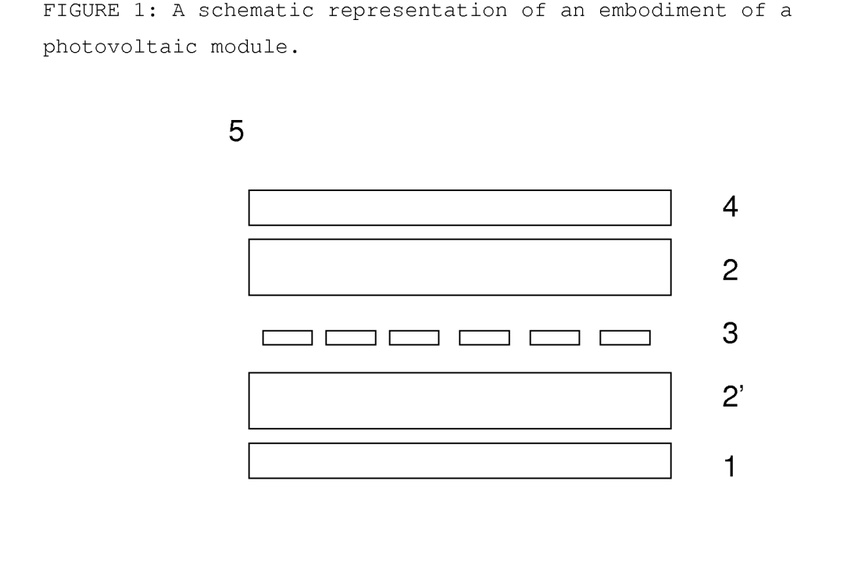
FIG. 1 shows a schematic representation of an embodiment of a photovoltaic module according to a preferred embodiment of the present invention.
Figure 2:
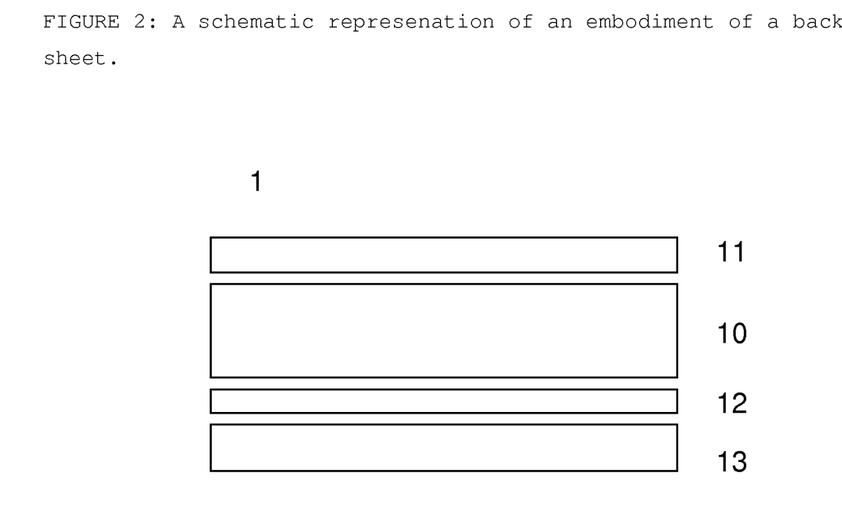
FIG. 2 shows a schematic representation of an embodiment of a backsheet according to a preferred embodiment of the present invention.

Preferred embodiments of the present invention provide a backsheet (1) for a photovoltaic module (5) comprising a support (10) and a weather resistant layer (13), the weather resistant layer comprising a binder containing a crosslinkable group, an isocyanate crosslinking agent and a catalyst capable of improving the crosslinking of the binder, characterized in that the catalyst is a zinc or bismuth based catalyst.

Weather Resistant Layer

The weather resistant layer comprises a binder containing a crosslinkable group, an isocyanate crosslinking agent and a catalyst which improves the crosslinking of the binder. The weather resistant layer may further comprise an UV absorber, surfactants or other ingredients to further optimize its properties.

Binder Having a Crosslinkable Group

The weather resistant layer comprises a binder containing a crosslinkable group. Such a crosslinkable group is also referred to as a functional group or a curable group.

The crosslinkable group of the binder may be selected from a hydroxyl group, a carboxyl group, an amino group, a glycidyl group, a silyl group, a silanate group, an epoxy group, a 1,3-dicarbonyl group (e.g. aceto acetoxy methacrylate of diacetone acrylamide), or an isocyanate group. Among these, a hydroxyl group is particularly preferred.

In a preferred embodiment, the binder is a fluorine-based polymer having a crosslinkable group such as disclosed in for example EP-A 1938967, WO2007072826 and EP-A 2309551.

A curable group may be introduced into the fluorine-based polymer by copolymerizing a fluoro-olefin with a monomer containing a curable group.

The fluoro-olefin may be tetrafluoro ethylene (TFE), chlorotrifluoro ethylene (CTFE), hexafluoro-propylene, vinyl fluoride, or vinylidene fluoride. Among these, TFE and CFTE are particularly preferred from the viewpoint of weatherability and solvent resistance of the coated layer. One type of fluoro-olefin may be used or two or more types may be used in combination. As the proportion of fluoro-olefin monomers in the fluoropolymer becomes larger, the weatherability of the coated film will improve. On the other hand, when it becomes smaller, the solubility of the fluoropolymer will improve. The proportion of fluoro-olefin monomer relative to the total monomer amount is preferably between 30 to 70 mol %, more preferably between 40 and 60 mol %.

The curable group is preferably a hydroxyl group. Such a hydroxyl group may be introduced into the fluorine-based polymer by using a hydroxyl-containing monomer. Examples of hydroxyl-containing monomers are hydroxyl-containing vinyl ethers such as 2-hydroxyethyl vinyl ether, 3-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether and 6-hydroxyhexyl vinyl ether, hydroxyl-containing allyl ethers such as 2-hydroxyethyl allyl ether, 4-hydroxybutyl allyl ether and glycerol monoallyl ether, or hydroxyalkyl esters of (meth)acrylic acids such as 2-hydroxyethyl acrylate and 2-hydroxy-ethyl methacrylate. Other examples are disclosed in EP2309551, paragraph [0024]-[0026]. Among these, hydroxyl-containing vinyl ethers, especially 4-hydroxybutyl vinyl ether and 2-hydroxyethyl vinyl ether, are particularly preferred.

The hydroxyl group content of the fluoropolymer is preferably between 30 and 200 mg KOH/g, more preferably between 40 and 150 mg KOH/g.

Examples of carboxyl-containing monomers, of amino-containing monomers, and of silyl-containing monomers are disclosed in EP-A 1938967, paragraphs [0028] to [0032] and EP2309551, paragraphs [0028] to [0036].

Besides the fluoro-olefin and the monomer containing the curable group, other monomers may be incorporated in the fluoropolymer. Preferred monomers have a $C_{2-20}$ linear or branched alkyl group and a polymerizable unsaturated group linked to each other by an ether or an ester bond. Examples of such monomers are disclosed in EP2309551, paragraph [0059]-[0077].

Other preferred monomers that may be used in combination with the monomers described above are for example ethylene, propylene, n-butene, isobutene, or vinyl benzoate.

Commercially available TFE fluoro-polymers are for example the Zeffle™ GK polymers from DAIKIN INDUSTRIES. Typical grades for solvent based applications are Zeffle GK570 and Zeffle GK571. Typical grades for water based applications are Zeffle SE-310, Zeffle SE-405, and Zeffle SE-700. Commercially available CTFE fluoropolymers are for example the LUMIFLON® polymers from ASAHI GLASS. Typical grades for solvent based applications are Lumiflon LF200F and Lumiflon FL916F. Typical grades for water based applications are Lumiflon FD1000 and Lumiflon FE4300. Other commercially available fluoropolymers which may be used are for example the FLUONATE™ fluoropolymers from DAINIPPON INK&CHEMICALS, for example Fluonate K-700 and K-702 for solvent based coatings. The commercially available OBBLIGATO® coating formulations from AGC COAT-TECH, for example Obbligato SW0011F Clear, also contain a fluoro-polymer containing a crosslinkable group.

Fluorinated Oxetane polymers and oligomers with the tradename POLYFOX from the company OMNOVA, such as Polyfox 652, Polyfox PF159N, Polyfox 6520 for solvent based applications and Polyfox 652, and Polyfox PF159N and Polyfox 6520 for water based applications may also be used. Other fluoropolymers which can be used are Acrymax grades from Acrymax technolgies Inc, e.g Acrymax AF-5500 and copolymers of trifluoroethyl methacrylate, such as Neocryl AF10, available from DSM Neoresins.

In another preferred embodiment, the binder is an acrylic resin comprising crosslinkable groups. Such polymers are typically copolymers of alkyl(meth)acrylate monomers and hydroxyl containing (meth)acrylate monomers. Preferred monomers are methyl(meth)acrylate, butyl(meth)acrylate and hydroxyethyl(meth)acrylate. Such acrylic resins are for example the commercially available DEGALAN® acrylic resins from EVONIK, and the URACRON™ and NEOCRYL™ acrylic resins from DSM, and the SYNOCURE™ acrylic resins from CRAY VALLEY ACRYLICS. Other acrylic resins which can be used are ENCOR 2171 (previously Craymul 2171) from ARKEMA, BAYHYDROL grades, e.g. Bayhydrol A2601 from BAYER, JONCRYL grades, such as Joncryl OH8312 from BASF.

EP-A 2416381 discloses an acrylic polyol that may also be used in the weather resistant layer of the present invention. The acrylic polyol is obtained by copolymerizing an acrylic monomer containing a hydroxyl group and another monomer containing an unsaturated double bond. The acrylic polyol may also comprise an ultraviolet stabilizing group, preferably a Hindered Amine Light Stabilizing (HALS) compound, and/or an ultraviolet absorbing group. Such copolymers may be obtained by copolymerizing HALS-containing monomers and/or UV absorbing monomers with the acrylic polyol monomers. Preferred HALS containing monomers and UV absorbing compounds are those disclosed in EP-A 2416381, paragraph [0034] and [0035] respectively.

Commercially available acrylic polyol containing a UV absorbing compound and a HALS compound are the HALSHYBRID UV-G series from NIPPON SHOKUBAI.

Other binders that may be used are selected from polyether polyols, polyester polyols, and polycarbonate diols.

Also, a mixture of both aforementioned reactive binders may be used.

Moreover, in addition to a reactive binder having a crosslinkable group, binders having no reactive group may also be added to the weather resistant layer.

Crosslinking Agents

The crosslinking agents are isocyanate compounds. Standard commercial polyisocyanates are all derived from just a few diisocyanates with aliphatic, alicyclic (or cyclic aliphatic) or aromatic isocyanate groups.

The most important diisocyanates that are available on an industrial scale are summarized in Table 1.

TABLE 1

| Chemical Formula | Chemical name |
|---|---|
|  | Hexamethylene diisocyanate (HDI) |

TABLE 1-continued

| Chemical Formula | Chemical name |
| --- | --- |
| | Isophorone diisocyanate (IPDI) |
| | Bis(4-isocyanato-cyclohexyl)methane (H12MDI) |
| | 2,4 and 2,6-toluene diisocyanate (TDI) |
| | Diphenylmethane-4,4' and/or-2,4'-diisocyanate (MDI) |
| | 2,2,4- and 2,4,4-trimethyl-hexamethylene diisocyanate (TMDI) |
| | meta-xylylenediisocyanate (XDI) |
| | Hexahydro-meta-xylylenediisocyanate (1,3-H6XDI) |

TABLE 1-continued

| Chemical Formula | Chemical name |
| --- | --- |
| (structure) | Tetramethyl-meta-xylylene diisocyanate (TMXDI) |

With the exception of MDI, the diisocyanate compounds of the table above are classified as toxic substances. For this reason, and also to increase the functionality, the diisocyanates are converted to polyisocyanates. Polyisocyanates with a functionality of greater than 2 makes spatial cross-linking possible.

The manufacturing process for making these polyisocyanate compounds results in oligomer mixtures exhibiting a molecular weight distribution. This makes it possible to optimize the products towards viscosity, isocyanate functionality, etc.

Aliphatic polyisocyanate compounds may be derived from HDI and TMDI, alicyclic polyisocyanate compounds from IPDI, H12MDI and 1,3-H6XDI, and aromatic polyisocyanate compounds from TDI, MDI, XDI and TMXDI.

Prepolymers based on aliphatic or aromatic diisocyanates may also be used. Such products may be obtained by the reaction of diisocyanates with long-chain polyols, especially polyether polyols.

The weather resistant layer may comprise aliphatic, aromatic or alicyclic isocyanate crosslinking agents, or a combination thereof. The weather resistant layer preferably comprises in addition to an aliphatic isocyanate crosslinking agent, an aromatic or an alicyclic isocyanate crosslinking agent.

The molar ratio of the isocyanate groups of all the isocyanate crosslinking agents and the crosslinkable groups, preferably the hydroxyl groups, of the binder ([NCO]/[OH]) is preferably between 0.25 to 2.5, more preferably between 0.50 and 1.75, most preferably between 0.75 and 1.50. It has been observed that the molar ratio [NCO]/[OH] is preferably higher for aqueous layers than for solvent based layers probably because water may react with NCO groups, making them unavailable for the crosslinking reaction.

Catalyst

Zn or Bi based catalysts are added to improve the crosslinking efficiency of the binder. It has been found that it is advantageous to use such Zn or Bi based catalysts instead of commonly used Sn based catalysts such as dibutyl tin dilaurate (DBTL) or dioctyl tin laurate. For example, with Bi and Zn based catalysts, an optimal curing speed was obtained combining good physical properties of the weather resistant layer and an efficient production of that layer.

Zinc based catalysts are for example K-KAT-XK-622 and XK-614 from King Industries and Octa-Soligen® Zn catalysts from Borchers.

Bismuth based catalysts are preferably used. Bismuth based catalysts are for example Borchi® Kat 0243, Borchi® Kat 0244 and Borchi® Kat 315 from Borchers and Dabco® MB20 from Air Products.

Borchi® Kat 0244 comprises both bismuth and zinc.

The amount of catalyst depends on the type of catalyst but is preferably between 0.005 and 3.00 wt % relative to the total amount of binder having a crosslinkable group, more preferably between 0.05 and 2.00 wt %, most preferably between 0.1 and 1.00 wt %.

UV Light Absorbers—UV Light Stabilizers

To protect the support from UV light, the weather resistant layer preferably comprises a UV light absorber and/or an UV light stabilizer.

A UV light absorbing compound absorbs at least part of the UV light that reaches the weather resistant layer.

The UV light absorbing compound may be an organic or an inorganic UV absorbing compound.

The UV light absorbing compounds and UV light stabilizers that may be added to the polyester support (see below) may also be used in the weather resistant layer.

Preferred UV light absorbing compounds for the weather resistant layer are inorganic UV absorbing particles such as Ti02 particles, ZnO particles and mixtures thereof.

The particle size of these inorganic UV absorbing compounds is preferably between 0.01 and 5.00 µm, more preferably between 0.10 and 2.50 µm, most preferably between 0.20 and 1.00 µm.

The amount of the inorganic UV absorbing particles is preferably between 2.5 and 20 g/m2, more preferably between 5 and 15 g/m2.

Other Ingredients

The outer layer may also comprise other ingredients such as surfactants, fillers such as for example colloidal silica, and others to further optimize its properties.

Support

The support, also referred to as substrate, used in the backsheet is preferably a polymeric support. The support may be provided with additional layers to improve the adhesion towards the encapsulant and/or the weather resistant layer.

Examples of a polymeric support include supports made of polyesters, polyolefins, such as polypropylene and polyethylene, or polyamides, such as polyamide 12 (Nylon 12). Examples of polyesters that can be used for the support are polyethylene terephthalate (PET), polybutylene terephthalate (PBT), 2,6-naphthalene terephthalate (PEN), a copolymer of 1,4-cyclohexanedimethanol, 1,2-ethanediol and 1,4-benzenedicarboxylic acid (PETG) and a copolyester containing isosorbide. A particularly preferred support is a PET support.

Production of a Polyester Support

A typical polyester resin production process comprises two phases: an esterification and/or transesterification step of a dicarboxylic acid, or its ester derivative, and a diol compound, followed by a polycondensation step.

Optionally, the resulting polyester after the polycondensation step may be subjected to a so called solid state polymerization to further increase the Molecular Weight (MW) of the polyester, for example to decrease the amount of terminal carboxyl groups.

The resulting polyester resin is then fed to a melt extruder to form a polyester film which is then biaxially stretched to form a biaxially oriented polyester film (i.e. the polyester support) having a specific thickness.

A catalyst is typically used in the polyester production process. Such a catalyst may be present in the esterification step, in the polycondensation step, or in both.

Several other compounds may be added during the polyester production process, to optimize the polymerization reaction and/or the physical properties of the resulting polyester resin or film. Such compounds may be present in the esterification step, in the polycondensation step, in both the esterification and the polycondensation step, or may be added together with the polyester resin to the melt extruder before film formation.

Dicarboxylic Acid

The dicarboxylic acids may be selected from aliphatic, alicyclic and aromatic dicarboxylic acids.

Examples of an aliphatic dicarboxylic acid are malonic acid, succinic acid, glutaric acid, adipic acid, suberic acid, sebacic acid, dodecanedioic acid, dimer acid, eicosane dioic acid, pimelic acid, azelaic acid, methylmalonic acid and ethylmalonic acid.

Examples of an alicyclic dicarboxylic acid are adamantane dicarboxylic acid, norbornene dicarboxylic acid, cyclohexanedicarboxylic acid and decalin dicarboxylic acid.

Examples of an aromatic dicarboxylic acid are terephthalic acid, isophthalic acid, phthalic acid, 1,4-naphthalene dicarboxylic acid, 1,5-naphthalene dicarboxylic acid, 2,6-naphthalene dicarboxylic acid, 1,8-naphthalene dicarboxylic, 4,4'-diphenyl dicarboxylic acid, 4,4'-diphenylether dicarboxylic acid, and 5-sodium-sulfoisophthalic acid.

Preferably, at least one aromatic dicarboxylic acid is used. More preferably, at least 80 wt % of the dicarboxylic acids used is an aromatic dicarboxylic acid. Most preferably, the dicarboxylic acids used are selected from terephthalic acid and isopthalic acid.

Diol Compound

The diol compounds may be selected from aliphatic diol compounds, alicyclic diol compounds and aromatic diol compounds.

Examples of aliphatic diol compounds are ethylene glycol, 1,2-propanediol, 1,3-propanediol, 1,4-butanediol, 1,2-butanediol, and 1,3-butanediol.

Examples of alicylic diol compounds are cyclohexane dimethanol, spiroglycol, isosorbide, and 2,2,4,4-tetramethyl-1,3-cyclobutanediol (CBDO).

Examples of aromatic diol compounds are bisphenol A, 1,3-benzene-dimethanol, and 1,4-benzenedimethanol.

Preferably, at least one aliphatic diol compound is used. Most preferably, ethylene glycol is used as diol compound.

Compounds Having Three or More Carboxyl Groups or Hydroxyl Groups

When using a small amount of compounds having three or more carboxyl groups or hydroxyl groups, branching of the polyester molecular chains may be induced, therefore promoting the entanglement of the polyester chains. As a result, when the polyester molecules are hydrolyzed and the molecular weight of the polyester is thereby lowered, embrittlement of the polyester film can be avoided. Such an entanglement may also inhibit thermal shrinkage of the polyester film. Such compounds and the preferred amounts used thereof are disclosed for example in US2011/0306747, paragraphs [0121] to [0127].

Esterification

The aromatic dicarboxylic acid and the aliphatic diol may be introduced into the production process by preparing a slurry containing these compounds, and supplying the slurry to the esterification phase. The esterification may be carried out using a multistage unit of at least two reactors connected in series, in which ethylene glycol is kept under reflux and water and alcohol formed by the reaction are removed out of the system.

The amount of the aliphatic diol, for example ethylene glycol, is preferably between 1.015 and 1.50 mol per mol of the aromatic dicarboxylic acid, for example terephthalic acid, or its ester derivative, more preferably between 1.10 and 1.30 mol, most preferably between 1.15 and 1.25 mol.

Polycondensation

The esterified product produced in the esterification step is then polycondensed. The polycondensation may be carried out in one stage or in multiple stages. The polycondensation is typically carried out under reduced pressure.

Catalyst

In the polyester production process, any known conventional catalyst may be used, such as alkali metal compounds, alkaline earth metal compounds, zinc compounds, lead compounds, manganese compounds, cobalt compounds, aluminium compounds, antimony compounds, titanium compounds, germanium compounds, or phosphorus compounds. Preferably an antimony compound, a germanium compound or a titanium compound is used in the polyester production.

Most preferably, a titanium catalyst (Ti catalyst) is used. The Ti catalyst includes oxides, hydroxides, alkoxides, carboxylates, carbonates, oxalates, organic chelate Ti complexes, and halides. Two or more different types of Ti compounds may be used. Preferred Ti catalysts are organic chelate Ti complexes with an organic acid as a ligand. The organic acid may be selected from citric acid, lactic acid, trimellitic acid, and malic acid. Preferably a chelate Ti complex with citric acid as ligand is used. Such a citrate chelate Ti catalyst is commercially available as Tyzor AC422 from Dorf Ketal or Ti184 from Catalytic Technologies.

The catalyst may be added in the esterification phase, in the polycondensation phase or in both phases. The amount of the catalyst is preferably from 1 to 50 ppm, more preferably from 2 to 30 ppm, most preferably from 3 to 15 ppm, in terms of the Ti element.

Phosphorus Compound

Preferably, a pentavalent phosphorus compound not having an aromatic ring as a substituent is used in combination with a Ti catalyst.

The pentavalent phosphorus compound may be selected from trimethyl phosphate, triethyl phosphate, tri-n-butyl phosphate, trioctyl phosphate, tris(triethylene glycol)phosphate, methyl acid phosphate, ethyl acid phosphate, monobutyl phosphate, dibutyl phosphate, dioctyl phosphate, and triethylene glycol acid phosphate.

Most preferably trimethyl phosphate and triethyl phosphate are used. In combination with the citrate chelate Ti catalyst mentioned above, using trimethyl phosphate or triethyl phosphate results in a polyester resin having a balanced polymerization activity, color tone and thermal stability.

The pentavalent phosphorus compound is preferably added in the esterification phase, but may also be added to the polycondensation phase or to both phases. The amount of pentavalent phosphorus compound is preferably from 1 to 100 ppm, more preferably from 5 to 50 ppm, most preferably from 7.5 to 25 ppm, in terms of the P element.

Magnesium Compound

Adding a magnesium compound (Mg compound) imparts static electricity properties to the resin film. The magnesium compound may be selected from magnesium oxide, magnesium hydroxide, magnesium alkoxide, magnesium acetate, and magnesium carbonate. Among these magnesium compounds, magnesium acetate is preferred.

The Mg compound may be added in the esterification phase, in the polycondensation phase or in both phases. The Mg compound may also be added in the extruder, i.e. in the melt. The amount of the magnesium compound is preferably from 1 to 100 ppm, more preferably from 2 to 50 ppm, most preferably from 3 to 30 ppm, in terms of the Mg element.

Polyester Film Formation

Extrusion

After the polycondensation step, the polycondensation product is either directly fed to the melt extruder, or the polycondensate product is first pelletized and then melted in the extruder.

The melt temperature in the extruder is preferably from 250 to 320° C., more preferably from 260 to 310° C., most preferably from 270 to 300° C. The extruder may be a single-screw extruder or a multi-screw extruder. The extruder may be purged with nitrogen to prevent the formation of terminal carboxyl groups through thermal oxidative (or thermo-oxidative) decomposition.

The melt is preferably extruded out through an extrusion die via a gear pump and a filter unit.

The extruded melt is then cooled on one or more chill rolls to form a film thereon. The temperature of the chill rolls is preferably from 5 to 80° C., more preferably from 15 to 70° C., most preferably from 20 to 60° C. When two chill rolls are used, the temperature of both may be different, for example between 5 and 25° C. for the first chill roll and between 30 and 60° C. for the second chill roll.

To enhance the adhesion between the resin melt and the chill roll and to increase the cooling efficiency, static electricity is preferably applied to the chill roll before the melt is brought into contact therewith.

Stretching

The extruded film is then stretched, preferably biaxially stretched, to obtain the polyester film.

The draw ratio in both the longitudinal and the lateral direction is preferably between 2 and 5. In biaxial stretching, the order of longitudinal stretching (the Machine Direction (MD) or the running direction of the film) and lateral stretching (Cross Direction (CD) or the width direction) is not specifically defined. Preferably, the longitudinal stretching is carried out first.

It is preferred that the lateral draw ratio is larger than the longitudinal draw ratio. Preferably the lateral draw ratio/ longitudinal draw ratio is from 1.05 to 1.25, more preferably from 1.10 to 1.20.

The stretching temperature is preferably from 80 to 160° C., more preferably from 85 to 155° C. It is preferred that the stretching temperature in the latter stretching, preferably the lateral stretching, is higher than the temperature in the former stretching, preferably the longitudinal stretching.

Besides this stepwise biaxially stretching method, wherein stretching in a longitudinal direction and stretching in a width direction are performed separately, a simultaneous biaxially stretching method, wherein stretching in a longitudinal direction and stretching in a lateral direction are performed at the same time, may also be used.

Thermofixation

In order to complete crystal orientation and to impart flatness and dimensional stability to the biaxially stretched film, the film is preferably subjected to a heat treatment for 1 to 30 sec while the sides of the biaxially stretched film are fixed, preferably at a temperature equal or higher than the glass transition temperature (Tg) of the resin but lower than the melting temperature (Tm) thereof. Such a heat treatment is then followed by a uniform and gradual cooling to room temperature.

Such a treatment is often referred to as thermofixation.

When the thermofixation temperature is too low, the heat shrinkage of the resulting film increases. On the other hand, when the heat treatment temperature is too high, the hydrolytic stability of the resulting film decreases. Preferred thermofixation temperatures are between 160 and 250° C., more preferably between 175 and 235° C., most preferably between 200 and 225° C.

Relaxation

In addition to and after the thermofixation, a so called relaxation treatment may be carried out. Such a relaxation treatment is preferably carried out at a temperature from 80 to 160° C., more preferably from 100 to 140° C. The degree of relaxation is from 1 to 30%, more preferably from 2 to 25%, most preferably from 3 to 20%.

The relaxation may be attained in the lateral or longitudinal direction of the film, or in both directions.

Thickness of the Film

The thickness of the biaxially stretched polyester film is preferably between 75 μm and 500 μm, more preferably between 100 μm and 350 μm, most preferably between 125 μm and 250 μm.

Carboxyl Groups in the Polyester

Carboxyl groups present in the polyester may work as an acid catalyst in the hydrolysis of polyester molecules. Such hydrolysis, for example when the polyester is kept for a certain period of time in high moisture conditions, results in a decrease of the molecular weight and therefore in a decrease of the mechanical strength of the polyester film. To obtain a sufficient hydrolytic stability of the polyester film, the carboxyl group content is preferably as low as possible.

On the other hand, carboxyl groups at the surface of the polyester film may enhance the adhesion between the polyester film and layers provided thereon. For that reason, the carboxyl group content is preferably not zero.

The carboxyl group content of the polyester film is preferably between 0 and 40 meq/kg, more preferably between 5 and 20 meq/kg.

To ensure low concentrations of carboxyl groups in the polyester film, high temperatures during the complete preparation process of the film, for example during the polycondensation process, are kept as low as possible.

To further reduce the number of carboxyl groups of the polyester, compounds that react with a carboxyl group of the polyester may be added to the polyester. Examples of such compounds include carbodiimide compounds, epoxy compounds, and oxazoline compounds.

Carbodiimide Compounds

The carbodiimide compounds may be classified into monofunctional and polyfunctional carbodiimides. Examples of monofunctional carbo-diimides include N,N'- dicyclohexylcarbodiimide, 1,3-diisopropyl-carbodiimide, N,N'-diisopropylphenylcarbodiimide, N,N'-dimethyl-carbodiimide, N,N'-diisobutylcarbodiimide, N,N'-dioctylcarbodiimide, t-butylisopropylcarbodiimide, N,N'-diphenylcarbodiimide, N,N'-di-t-butyl-carbodiimide, 1-(3-dimethylaminopropyl)-3-ethyl carbodiimide, and dinaphthyl carbodiimide.

Examples of commercially available carbodiimide compounds include Stabaxol I from Rheinchemie and Stablizer 7000 from Rashig, both based on N,N'-diisopropylphenylcarbodiimide.

Polyfunctional carbodiimides are typically polycarbodiimide compounds, i.e. a polymer obtained by polymerizing a carbodiimide compound. An specific example of such a polycarbodiimide is poly(1,3,5-triisopropylphenylene-2,4-dicarbodiimide).

Examples of commercially available polymeric carbodiimides include Stabilizer 9000 from Raschig and Stabaxol P from Rheinchemie.

Other polymeric carbodiimides available from Rheinchemie are Stabaxol P100 and Stabaxol P200.

As carbodiimide compounds may generate an isocyanate-type gas through thermal decomposition, carbodiimide compounds having a high heat resistance are preferably used. It has been observed that an increase in molecular weight of polymeric carbodiimides, results in an improvement of the thermal decomposition.

Epoxy Compounds

Preferred examples of the epoxy compounds include glycidyl ester compounds and glycidyl ether compounds. Other preferred examples are those disclosed in WO2012120260 (for example Cardura E10P).

Other preferred epoxy compounds are epoxidized fatty acid esters or epoxidized fatty acid glycerides such as disclosed in US2010/0120946 paragraphs [0020] to [0067].

Still other preferred epoxy compounds are the so called chain extenders disclosed in for example US2010/0120947. Chain extenders are molecules with at least two reactive groups, preferably an epoxy group, which can react with the polyester during extrusion and join polyester chains to one another. Typically, their reactive groups are already depleted substantially (to an extent of 75% or more) during the extrusion and are no longer available for a chain repair during the use of the polyester film after the production thereof.

Preferred chain extenders are difunctional epoxides, even more preferred chain extenders are polyfunctional epoxides. The epoxy function is arranged terminally at the end of the molecule chain or of a side chain. Polyfunctional epoxides are preferred since lower amounts are required, higher molecular weight end products are formed, and lower level of gaseous cleavage products are formed. Commercially available chain extenders include polymers sold by BASF under the Joncryl ADR brand name.

Oxazoline Compounds

The oxazoline compounds are preferably bisoxazoline compounds such as 2,2'-bis(2-oxazoline), 2,2'-bis(4-methyl-2-oxazoline), 2,2'-bis(4,4'-dimethyl-2-oxazoline), 2,2'-bis(4-methyl-2-oxazoline), 2,2'-bis(4-ethyl-2-oxazoline), 2,2'-bis(4,4'-diethyl-2-oxazoline), 2,2'-bis(4-propyl-2-oxazoline), 2,2'-bis(4-butyl-2-oxazoline), 2,2'-bis(4-hexyl-2-oxazoline), 2,2'-bis(4-phenyl-2-oxazoline), 2,2'-bis(4-cylcohexyl-2-oxazoline), 2,2'-bis(4-benzyl-2-oxazoline), 2,2'-p-phenylenebis(2-oxazoline), 2,2'-m-phenylenebis(2-oazoline), 2,2'-o-phenylenebis(2-oxazoline), 2,2'-p-phenylene-bis(4-methyl-2-oxazoline), 2,2'-p-phenylenebis(4,4-dimethyl-2-oxazoline), 2,2'-m-phenylenebis(4,4-dimethyl-2-oxazoline), 2,2'-m-phenylenebis(4-methyl-2-oxazoline), 2,2'-m-phenylenebis(4,4-dimethyl-2-oxazoline), 2,2'-ethylenebis(2-oxazoline), 2,2'-tetramethylenebis(2-oxazoline), 2,2'-hexamethylenebis(2-oxazoline), 2,2'octamethylenebis (2-oxazoline), 2,2'-decamethylenebis(2-oxazoline), 2,2'-ethylenebis(4-methyl-2-oxazoline), 2,2'-ethylenebis(4,4-dimethyl-2-oxazoline), 2,2'-9,9'-diphenoxyethanebis(2-oxazoline), 2,2'-cyclohexylenebis(2-oxazoline) and 2,2'-diphenylenebis(2-oxazoline). Among these, 2,2'-bis(2-oxazoline) is most preferably used from the viewpoint of reactivity with the polyester.

A particularly preferred oxazoline compound is 2-Phenyl-4,5-dihydro-oxazole and 4,5-Dihydro-2-phenyl-6H-1,3-oxazine.

The bisoxazoline compounds may be used individually, or two or more different compounds may be used together.

The amount of the carbodiimide compounds, the epoxy compounds, or the oxazoline compounds in the polyester film is typically from 0.1 to 5 wt %, preferably from 0.3 to 4 wt %, more preferably from 0.5 to 3 wt %, relative to the total weight of the polyester resin.

UV Light Absorber/UV Light Stabilizer

To prevent degradation caused by UV light, UV light absorbers and/or UV light stabilizers may be added to the polyester film. UV light absorbers absorb UV light and convert it into heat energy, while UV light stabilizers scavenge radicals generated by photodecomposition of the polyester resin and prevent further decomposition of the resin. A degradation of the polyester resin may result in a decrease of the partial discharge voltage, in a decrease of the strength of the polyester film, and in a color tone change (for example yellowing) of the polyester film.

The UV light absorbing compound may be an organic or an inorganic UV absorbing compound.

Examples of organic UV light absorbers include salicyl acid compounds such as p-t-butylphenylsalicylate or p-octylphenyl salicylate, benzophenone compounds such as 2,4-dihydroxy benzophenone, 2-hydroxy-4-methoxy benzophenone, 2-hydroxy-4-methoxy-5-sulfo benzophenone, 2,2'4, 4'-tetrahydroxy benzophenone, and bis(2-methoxy-4-hydroxy-5-benzoylphenyl)methane, benzotriazole compounds such as 2-(2'-hydroxy-5'-methylphenyl)benzotriazole and 2,2'-methylene bis[4-(1,1,3,3-tetramethylbutyl)-6-(2H-benzotriazole-2-yl)phenol], cyanoacrylate compounds such as ethyl-2-cyano-3,3'-diphenyl acrylate, triazine compounds such as 2-(4,6-diphenyl-1,3,5-triadizine-2-yl)-5-[(hexyl)oxy]-phenol (Tinuvin 1577) and 2-(2-Hydroxy-4-(2-ethylhexyl)oxyphenyl)-4,6-di(4-phenylphenyl)-1,3,5-triazine (Tinuvin 1600) and, 2-[4-[4,6-bis([1,1'-biphenyl]-4-yl)-1,3,5-triazin-2-yl]-3-hydroxyphenoxy]-propanoic acid isooctyl ester (Tinuvin 479).

Examples of inorganic UV absorbers are $TiO_2$ particles, ZnO particles and mixtures thereof.

Examples of UV light stabilizers are hindered amine compounds such as bis(2,2,6,6-tetramethyl-4-piperidyl)sebacate and the polycondensate of dimethylsuccinate and 1-(2-hydroxyethyl)-4-hydroxy-2,2,6,6-tetramethyl piperidine.

The content of the UV light absorber or UV light stabilizer in the polyester resin composition is preferably from 0.1 to 10 wt %, more preferably from 0.3 to 7 wt %, even more preferably from 0.7 to 4 wt %.

Other Additives

It is preferred to add inorganic particles to the polyester to optimize properties as slipperiness, abrasion resistance, scratch resistance of the surface of the polyester film. Examples of inorganic particles are for example particles of clay, mica, titanium oxide, calcium carbonate, kaolin, talc, silica, calcium phosphate, barium sulfate, alumina, and zirconia.

Preferred inorganic particles are silica and alumina. The amount of silica and/or alumina is preferably between 0.025 and 1.500 wt %, more preferably between 0.050 and 1.000 wt %.

Optical brighteners such as 2,5-thiophenediylbis(5-tert-butyl-1,3-benzoxazole) (Uvitex OB, Benetex OB Plus) may also be added to the polyester.

Master Batch Technology

It is preferred that additives such as inorganic particles, UV light absorbing compounds, additives to improve the hydrolytic resistance are added to the polyester resin by means of a so called master batch. To prepare such a master batch, the additive is first dispersed in a carrier material. The carrier material is preferably polyester, but it may be another polymer which is compatible with polyester. The master batch is added to the polyester in the melt extruder, before film production, resulting in the components of the master batch being dissolved or finely dispersed in the polyester.

Surface Treatment

The polymeric support may be surface treated, typically to enhance the adhesion between the support and layers provided thereon.

Examples of such a surface treatment include a corona discharge treatment, a flame treatment, an UV treatment, a low pressure plasma treatment, and an atmospheric plasma treatment. A chemical treatment of the surface is also known in the art.

In a corona discharge treatment, typically high frequency and high voltage electricity is applied between a metal roll coated with a dielectric substance and insulated electrodes to induce ionization of the air between the electrodes, i.e. a corona discharge. A corona discharge treatment of the support is performed by passing the support through the corona discharge. Coronization may also been performed in modified atmospheric conditions.

For example, a gap distance between the electrodes and the dielectric roll may be from 1 to 3 mm, a frequency of 1 to 100 kHz, and an applied energy of 0.2 to 5 kV·A·min/m$^2$ may be used.

In a flame treatment, the outer flame portion of a flame is brought into contact with the support. Care has to be taken that the flame, uniformly hits the support surface. This may be achieved by using plural, circular-shaped burners. Examples of the combustion gas that may be used in a flame treatment include paraffin-based gases such as natural gas, methane gas, ethane gas, propane gas and butane gas, and olefin-based gases such as ethylene gas, propylene gas, and acetylene gas. These gases may be used singly, or as mixtures of two or more gases. Oxygen or air is preferably used as an oxidizing gas that is mixed with the combustion gas.

A flame treatment as disclosed in US2011/0284075, paragraph [0247] to [0258] is preferably used to optimize the surface energy of the polymeric support.

In an UV treatment, the surface of a support is irradiated with UV radiation to improve its adhesiveness and wettability. Typically, a low pressure mercury UV lamp is used as an UV radiation source. Preferably UV radiation at 254 nm, more preferably at 185 nm is used in such a UV treatment. The UV treatment is typically carried out for 1 to 500 seconds under atmospheric pressure.

In a low pressure plasma treatment, the surface of the support is treated with plasma, generated as a result of a discharge in a gas, the plasma gas, in a low pressure atmosphere. Examples of plasma gas that may be used include oxygen gas, nitrogen gas, water vapor gas, argon gas and helium gas. Preferably oxygen, or a mixed gas of oxygen gas and argon gas, are used. The pressure of the plasma gas is preferably in the range of 0.005 to 10 Torr, more preferably in the range of 0.008 to 3 Torr. The plasma output power is preferably from 100 to 2500 W, more preferably from 500 to 1500 W. The treatment time is preferably from 0.05 to 100 seconds, more preferably from 0.5 to 30 seconds. The plasma may be generated using a direct current glow discharge, a high frequency wave discharge, or a microwave discharge.

In an atmospheric pressure plasma treatment, a stable plasma discharge is generated at atmospheric pressure using high frequency waves. Argon gas or helium gas may be used as carrier gas. Oxygen gas may be mixed with the carrier gas. The atmospheric pressure plasma treatment is preferably carried out at atmospheric pressure or a pressure close to or below the atmospheric pressure, such as between 500 and 800 Torr. The power supply frequency of the discharge is preferably 1 to 100 kHz, more preferably 1 to 10 kHz. The discharge intensity is preferably from 50 to 500 W·min/m$^2$.

Functional Layers

The polyester film is provided with at least one functional layer, i.e. the weather resistant layer. However, other functional layers may also be provided, for example a primer to enhance the adhesion towards an encapsulant layer on one side of the polyester film and/or a primer to enhance the adhesion towards the weather resistant layer on the other side of the polyester film. These functional layers can be applied after uniaxial and/or biaxial stretching of the polyester film.

Known coating techniques such as roll coating, knife coating, gravure coating, or curtain coating may be used to apply the functional layers on the support.

The functional layers may be applied from water based or solvent based coating solutions, preferably from water based solutions.

Primer to the Encapsulant

The surface of the polymeric support may be provided with a primer or adhesive layer to improve the adhesion of the backsheet to the encapsulant or sealing material. The backsheet then comprises the weather resistant layer (13) on one side of the support and a primer (11) on the other side of the support to enhance the adhesion of the backsheet towards an encapsulant layer (2').

The primer may comprise a binder. The binder may be selected from polyolefins, polyesters, acrylic resins and polyurethanes. The binder may also be a composite resin of acrylic polymer and silicone. Examples of such binders are Chemipearl S-120 and S-75N, both polyolefins from Mitsui Cemicals, Jurymer ET-410 and SEK-301, both acrylic resins from Nihon Junyaku, Ceranate WSA1060 and 1070, both composite resins of an acrylic polymer and silicone from DIC, and H7620, H7630, and H7650, all composite resins of an acrylic polymer and silicone from Asahi Kasei Chemicals.

The amount of binder is typically from 0.05 to 5.00 g/m$^2$, more preferably from 0.08 to 3.00 g/m$^2$.

The primer may also comprise crosslinking agents, selected from epoxy compounds, isocyanate compounds, melamine compounds, carbodiimide compounds and oxazoline compounds. Examples of oxazoline compounds are disclosed WO2011/118844 paragraph [0058]-[0060]. Commercially available oxazoline compounds are for example EPOCROS K2010E, K2020E, WS-500, WS-700 all available from Nippon Shokubai.

EP-A 2479026 discloses a preferred polyurethane based primer wherein the polyurethane has a polycarbonate or a polyether skeleton and wherein the primer further comprises a crosslinking agent. Preferred crosslinking agents are oxazoline and carbodiimide compounds. The polyurethane is preferably used in the form of a dispersion or a solution having water as medium. For that reason, the crosslinking agents are also preferably water-soluble or water-dispersible.

It has been observed that a crosslinkable fluorpolymer, such as those described below for the weather resistant layer, may also be used as binder for the primer towards the encapsulant.

The primer may contain inorganic fine particles. These may be selected from silica, calcium carbonate, magnesium oxide, magnesium carbonate, and tin oxide. Tin oxide and silica are preferred.

The particle size of the inorganic particles is preferably from 10 to 700 nm, more preferably from 20 to 300 nm.

The amount of these inorganic particles is preferably between 5 and 400 wt %, more preferably between 10 and 300 wt %, relative to the binder.

The primer may also contain matting agents, such as polystyrene, poly(methyl methacrylate) or polyamide matting agents.

The primer may also contain a surfactant, such as an anionic or nonionic surfactant.

The primer is preferably applied on the polymeric support by coating a coating liquid on the support. Any known coating method, such as gravure coating, roll coating, bar coating, knife coating or curtain coating may be used.

The coating solvent may be water or an organic solvent, such as for example MEK, ethyl acetate, or butyl acetate.

The thickness of the primer is preferably between 0.05 and 8 µm, more preferably between 0.1 and 5 µm. The primer may consist of one layer or of two or more layers.

The surface of the support on which the primer is applied may be surface treated, as described above, to improve the adhesion of the primer (and the encapsulant) to the polymeric support.

The coating solution of the primer may be applied on the polymeric support before or after the support has been biaxially stretched or, more preferably, in between the longitudinal and lateral stretching.

Primer to the Weather Resistant Layer

A primer (12) may be provided between the polymeric support (10) and the weather resistant layer (13) to improve the adhesion between both.

The thickness of such a primer is preferably less than 2 µm, more preferably between 0.05 and 2.00 µm, even more preferably between 0.1 and 1.50 µm.

The primer may contain a binder, for example polyesters, polyurethanes, acrylic resins, or polyolefins. Apart from the binder, the primer may also contain compounds selected from epoxy compounds, isocyanate compounds, melamine compounds, carbodiimide compounds and oxazoline compounds, a surfactant selected from anionic and nonionic surfactants, or a filler, such as silica.

The coating method for the primer may be any conventional coating method, for example a gravure coater of a bar coater may be used.

The coating solvent of the coating solution may be water or an organic solvent such as toluene or MEK. One or more solvents may be used singly or in combination.

The coating solution may be applied on the polymeric support before or after the support has been biaxially stretched or, more preferably, in between the lateral and longitudinal stretching.

Weather Resistant Layer

The total dry coating weight of the weather resistant layer is preferably between 5 and 75 g/m$^2$, more preferably between 10 and 50 g/m$^2$, most preferably between 15 and 35 g/m$^2$.

The weather resistant layer may be coated from an aqueous or non-aqueous coating solution.

When a solvent based coating solution is used, preferred solvents are Methyl Ethyl Ketone (MEK), n-butylacetate, and ethylacetate.

When an aqueous coating solution is used, organic solvents may be mixed with water to improve the solubility of the ingredients. Examples of such solvents are acetone, methoxypropanol and glycolethers.

The weather resistant layer is preferably applied after the support has been biaxially stretched. The layer is preferably applied "online", i.e. immediately after biaxially stretching the support.

Solar Cell Module

FIG. 1 schematically represents an embodiment of a photovoltaic module according to a preferred embodiment of the present invention.

The solar cell module (5) has a configuration in which a solar cell element (3), which converts the light energy of sunlight to electrical energy, is disposed between a transparent sheet (4) through which sunlight enters (also referred to as the frontsheet) and the backsheet (1) according to a preferred embodiment of the present invention. The solar cell element (3) is encapsulated by an encapsulant or sealing layer (2, 2').

Such a solar cell module is typically prepared by laminating all components, i.e. backsheet, front sheet, encapsulant sheets and the solar cell element, in one step.

A preferred embodiment of a backsheet (1) according to the present invention is schematically represented in FIG. 2.

The backsheet (1) comprises a polymeric support (10), on one side of the support an optional primer (12) and a weather resistant layer (13), and a primer (11) on the other side of the support to enhance the adhesion towards an encapsulant layer (2').

Figure 3:
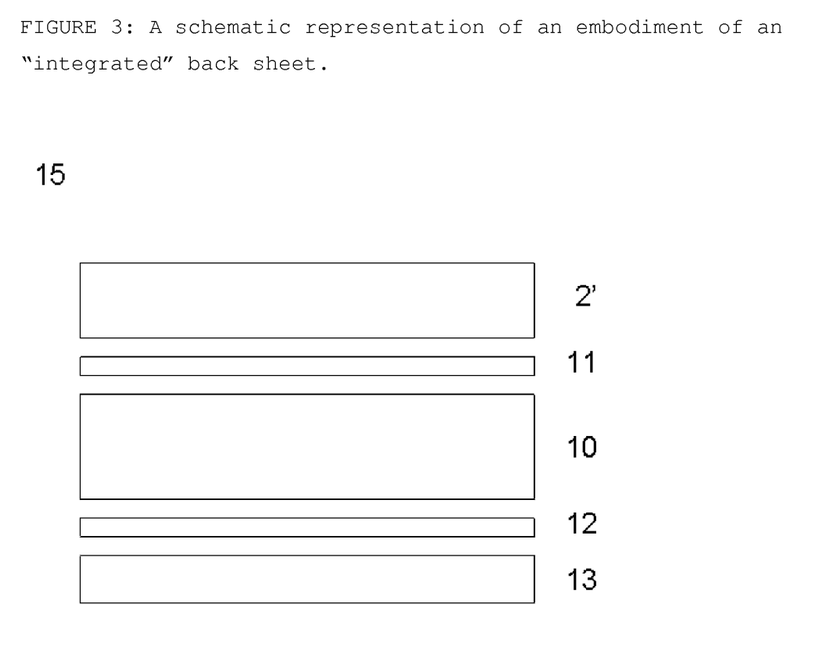
FIG. 3 shows a schematic representation of an embodiment of an "integrated" backsheet according to a preferred embodiment of the present invention.

To simplify the assembly of a solar cell module by the module manufacturer, it may be preferred to integrate the backsheet (1) and the encapsulant layer (2'). Such an "intergrated backlayer" may have a positive influence on the cost price of the solar cell module.

FIG. 3 schematically represents an embodiment wherein the backsheet according to the present invention (1) is integrated with an encapsulant layer (2'). The encapsulant layer (2') may be applied to the backsheet (1) by a laminating an encapsulant layer on the backsheet or by extrusion coating an encapsulant layer on the backsheet.

EXAMPLES

Materials

All materials used in the examples were readily available from standard sources such as Aldrich Chemical Co. (Belgium) and Acros (Belgium) unless otherwise specified.

Zeffle GK570, a fluorine containing polymer from DAIKIN.

TiO$_2$, TiPure R-706, a TiO$_2$ grade from DUPONT DE NEMOURS.

Desmodur N3300, an aliphatic polyisocyanate (oligomer containing HDI trimer) from BAYER.

DBTL, Dabco® T-12, a dibutyltindilaurate catalyst from Air Products.
Dabco® MB20, a bismuth based catalyst from Air Products.
Borchi® Kat 315, a bismuth based catalyst from OMG Borchers.
Borchi® Kat 0244, a bismuth-zinc based catalyst from OMG Borchers.
K Kat XK 614, a zinc based catalyst from King Industries.
K Kat XK 622, a zinc based catalyst from King Industries.

Example 1

In this example, different amounts of different catalysts were evaluated. The composition of the coatings (dry coating weight, g/m²) are shown in Table 2.

All samples contain a fixed amount of Zeffle GK570 and $TiO_2$.

Zeffle GK570 was added to the coating solution as a 65 wt % solution in n-butylacetate.

$TiO_2$ was added as a 66.7 wt % dispersion in 33.3 wt % Zeffle GK570 (50 g $TiO_2$, 25 g Zeffle GK570 and butylacetate until 100 g dispersion).

The catalyst was added as a 10 wt % solution in MEK.

Desmodur N3300 was added as a 30 wt % solution in n-butylacetate.

Methyl ethyl ketone (MEK) and n-butylacetate were used as coating solvent.

The reactive, crosslinkable groups of the Zeffle GK-570 binder are hydroxyl groups. The molar ratio [NCO]/[OH] was kept at 1.1/1. To calculate the molar ratio [NCO]/[OH], it was taken into account that Desmodur N3300 contains 21.80 g NCO/100 g and Zeffle GK570 contains 60 mg KOH/g polymer.

The coating solutions were hand coated on a colonized PET substrate using a Baker coating applicator. The wet coating thickness was 50 μm. The coating was air dried for 20 seconds and then put into an oven at 120° C. for 10 minutes. To minimize the amount the amount of residual NCO groups, the coating was then kept overnight at 90° C. for another 15 hours.

TABLE 2

| Ingredients (g/m²) | COMP-01 | COMP-02 | COMP-03 | COMP-04 | COMP-05 |
|---|---|---|---|---|---|
| Zeffle GK-570 | 12.20 | = | = | = | = |
| $TiO_2$ | 9.50 | = | = | = | = |
| Desmodur N3300 | 2.90 | = | = | = | = |
| DBTL | — | 0.12 | 0.10 | 0.07 | 0.05 |

| Ingredients (g/m²) | INV-01 | INV-02 | INV-03 | INV-04 | INV-05 |
|---|---|---|---|---|---|
| Zeffle GK-570 | 12.20 | = | = | = | = |
| $TiO_2$ | 9.50 | = | = | = | = |
| Desmodur N3300 | 2.9 | = | = | = | = |
| DABCO MB20 | 0.12 | 0.10 | 0.07 | 0.05 | — |
| BORCHI KAT 315 | — | — | — | — | 0.12 |

| Ingredients (g/m²) | INV-06 | INV-07 | INV-08 | INV-09 | INV-10 |
|---|---|---|---|---|---|
| Zeffle GK-570 | 12.20 | = | = | = | = |
| $TiO_2$ | 9.50 | = | = | = | = |
| Desmodur N3300 | 2.90 | = | = | = | = |
| BORCHI KAT 315 | 0.10 | 0.07 | 0.05 | — | — |
| BORCHI KAT 244 | — | — | — | 0.12 | 0.10 |

| Ingredients (g/m²) | INV-11 | INV-12 | INV-13 | INV-14 | INV-15 |
|---|---|---|---|---|---|
| Zeffle GK-570 | 12.20 | = | = | = | = |
| $TiO_2$ | 9.50 | = | = | = | = |
| Desmodur N3300 | 2.90 | = | = | = | = |

TABLE 2-continued

| | | | | | |
|---|---|---|---|---|---|
| BORCHI KAT 244 | 0.07 | 0.05 | — | — | — |
| K KAT XK 614 | — | — | 0.12 | 0.10 | 0.07 |

| Ingredients (g/m²) | INV-16 | INV-17 | INV-18 | INV-19 | INV-20 |
|---|---|---|---|---|---|
| Zeffle GK-570 | 12.20 | = | = | = | = |
| $TiO_2$ | 9.50 | = | = | = | = |
| Desmodur N3300 | 2.90 | = | = | = | = |
| K KAT XK 614 | 0.05 | — | — | — | — |
| K KAT XK 622 | — | 0.12 | 0.10 | 0.07 | 0.05 |

First, the visual quality of the coatings was determined. It was performed after the initial curing and the coating was reported as either OK or not OK depending on its visual appearance, i.e. glossiness, presence of defects and brittleness.

Stickiness of the Coatings.

The coatings were air dried for 20 seconds and then cured at 120° C. for 30 seconds. A 5 cm×5 cm PET substrate was pressed on the coated layer with roller. The substrate was then slowly peeled off from the coated layer.

The noise associated with the peeling off was evaluated as shown in Table 3.

TABLE 3

| Level | sound |
|---|---|
| 0 | No noise |
| 1 | Very light static |
| 2 | Light static |
| 3 | Static-like noise |
| 4 | Crackling noise |
| 5 | Very loud crackling noise |

The amount of the coating that was removed by peeling off the substrate was evaluated as shown in Table 4.

TABLE 4

| Level | Coating removed |
|---|---|
| 0 | Coating intact, no damage |
| 1 | Coating very slightly damaged, a small piece of the coating was ripped off |
| 2 | Coating slightly damaged, a few pieces of the coating were ripped off |
| 3 | Coating was damaged, a few big pieces of the coating were ripped off |
| 4 | Coating was quite heavily damaged, large areas of the coating were ripped off |
| 5 | Coating was almost completely ripped off |

The overall stickiness ranking was carried out as shown in Table 5, i.e. the highest number/level of both was taken as overall stickiness value.

TABLE 5

| | Noise Level | | | | | |
|---|---|---|---|---|---|---|
| Removal level | 0 | 1 | 2 | 3 | 4 | 5 |
| 0 | 0 | 1 | 2 | 3 | 4 | 5 |
| 1 | 1 | 1 | 2 | 3 | 4 | 5 |
| 2 | 2 | 2 | 2 | 3 | 4 | 5 |
| 3 | 3 | 3 | 3 | 3 | 4 | 5 |
| 4 | 4 | 4 | 4 | 4 | 4 | 5 |
| 5 | 5 | 5 | 5 | 5 | 5 | 5 |

Adhesion Testing

After overnight curing (90° C. during ±15 hours) the coatings were tested for adhesion using the Cross-Hatch test.

Additionally, the wet adhesion was also tested wherein the coating was placed in a water bath for 24 hours at 85° C. before carrying out the Cross-Hatch test. The adhesion was ranked using the BS/ISO/DIN reporting system, i.e. from 0 to 5 wherein 0-1 is considered an acceptable adhesion and 2-5 a bad adhesion.

The adhesion, dry and wet, was OK for all samples. The overall stickiness results are shown in Table 6.

Table 6 also shows the Pot Life of the different coating solutions. Pot Life is the time the coating solution can be kept before the viscosity becomes too high to coat (i.e. >20 mPa·s) The viscosity was measured using a Zahn cup #1.

TABLE 6

|  | Pot Life | Overall Stickiness |
|---|---|---|
| COMP-01 | >24 hour | 4 |
| COMP-02 | <30 min | 0 |
| COMP-03 | <30 min | 0 |
| COMP-04 | ±1 hour | 0 |
| COMP-05 | ±2 hour | 0 |
| INV-01 | >4 hours | 0 |
| INV-02 | >4 hours | 0 |
| INV-03 | >4 hours | 1 |
| INV-04 | >4 hours | 1 |
| INV-05 | >4 hours | 0 |
| INV-06 | >4 hours | 0 |
| INV-07 | >4 hours | 1 |
| INV-08 | >4 hours | 1 |
| INV-09 | >4 hours | 1 |
| INV-10 | >4 hours | 1 |
| INV-11 | >4 hours | 2 |
| INV-12 | >4 hours | 3 |
| INV-13 | >24 hours | 2 |
| INV-14 | >24 hours | 3 |
| INV-15 | >24 hours | 3 |
| INV-16 | >24 hours | 3 |
| INV-17 | >24 hours | 1-2 |
| INV-18 | >24 hours | 2 |
| INV-19 | >24 hours | 3 |
| INV-20 | >24 hours | 3 |

It is clear from Table 6 that the stickiness of the coating without any catalyst (COMP-01) is unacceptable.

All coatings comprising a catalyst show less stickiness, the amount of stickiness depending on the concentration of the catalyst used.

Regarding the pot life, it is clear from Table 6 that the coating solutions comprising DBTL (dibutyldilaurate) as catalyst have a very limited pot life.

The coating solutions comprising Bi or Zn based catalysts all have a longer pot life compared to those comprising DBTL, making them more suitable for large scale production of backsheets.

Using Bi or Zn based catalysts instead of the well known Sn based catalyst improves the stickiness of the coatings with an acceptable pot life of the coating solutions.

Example 2

Comparative examples 06 and 07 and the inventive examples 21 and 22 were prepared as described in Example 1. Their composition is given in Table 7.

TABLE 7

| Ingredients (g/m$^2$) | COMP-06 | COMP-07 | INV-21 | INV-22 |
|---|---|---|---|---|
| Zeffle GK-570 | 12.20 | = | = | = |
| TiO$_2$ | 9.70 | = | = | = |
| Desmodur N3300 | 2.90 | = | = | = |
| DBTL | — | 0.20 | — | — |
| DABCO MB20 | — | — | 0.40 | — |
| BORCHI 315 | — | — | — | 0.40 |

Table 8 shows the colour change (yellowing) of the samples when they are kept under different conditions.

In the Damp Heat Test (DHT), the samples were kept at 85° C. and a relative humidity (RH) of 85% for 500 and 1000 hours. Colour changes during storage were evaluated by CIE ΔE (1976) and the Yellowness Index YI$_{313}$ (ASTM E313).

In the suntest the samples were kept under a Xe lamp for 12 days.

TABLE 8

|  | DHT 500 h | | DHT 1000 h | | Sun Test | |
|---|---|---|---|---|---|---|
|  | ΔE | ΔY313 | ΔE | ΔY313 | ΔE | ΔY313 |
| COMP-06 | 0.77 | 1.25 | 1.33 | 2.26 | 0.89 | 1.67 |
| COMP-07 | 1.05 | 1.72 | 1.84 | 3.06 | 1.20 | 1.87 |
| INV-21 | 0.90 | 1.50 | 1.32 | 2.17 | 0.97 | 1.78 |
| INV-22 | 0.85 | 1.37 | 1.22 | 2.00 | 0.90 | 1.71 |

It is clear from Table 8 that the weather resistant layers comprising dibutyltindilaurate as catalyst (COMP-07) show more colour change when stored under different condition compared to those comprising no catalyst (COMP-06) or a Bi based catalyst (INV-21, INV-22).

Table 9 shows the opacity of the samples and the adhesion after Pressure Cook Test (PCT, 120° C., 2 bar, 100% RH, 45 hours). The adhesion was measured as in example 1. The opacity was measured with a Konica Minolta Spectrophotometer CM-5.

TABLE 9

|  | Adhesion PCT (45 h) | Opacity |
|---|---|---|
| COMP-06 | 2 | 86.97 |
| COMP-07 | 5 | 87.80 |
| INV-21 | 1 | 88.73 |
| INV-22 | 1 | 89.77 |

From Table 9 it is clear that the weather resistant layers comprising a Bi based catalyst have a higher opacity compared with the others. Also, these inventive layers have a better adhesion after the PCT test.

The invention claimed is:

1. A backsheet for a photovoltaic module, the backsheet comprising:
    a support; and
    a weather resistant layer including a binder containing a crosslinkable group, an isocyanate crosslinking agent, and a catalyst that improves crosslinking of the binder; wherein
    the catalyst is a bismuth-based catalyst.

2. The backsheet according to claim 1, wherein an amount of the catalyst is between 0.005 wt % and 3.00 wt % relative to a total weight of the binder.

3. The backsheet according to claim 1, wherein the binder is a fluorine-based polymer.

4. The backsheet according to claim 1, wherein the crosslinkable group is a hydroxyl group.

5. The backsheet according to claim 4, wherein a molar ratio of a total amount of isocyanate groups in the isocyanate crosslinking agent to a total amount of the hydroxyl groups in the binder ([NCO]/[OH]) is between 0.25 to 2.50.

6. The backsheet according to claim 1, wherein the weather resistant layer includes TiO2 particles.

7. The backsheet according to claim 1, wherein the weather resistant layer is provided on a first side of the support, a primer is provided on a second side of the support, and the primer includes a binder.

8. A solar cell module comprising:
the backsheet as defined in claim 1.

9. An integrated backsheet comprising:
the backsheet as defined in claim 1; and
an encapsulant layer.

10. A method for preparing the backsheet as defined in claim 1, the method comprising the steps of:
providing the support; and
applying the weather resistant layer on a first side of the support.

11. The method according to claim 10, wherein the weather resistant layer is applied on the support by coating an aqueous solution or a non-aqueous coating solution.

12. The method according to claim 10, further comprising the step of:
surface treating the first side of the support onto which the weather resistant layer is applied.

13. The method according to claim 10, further comprising the step of:
applying a primer on a second side of the support facing an encapsulant layer.

14. The method according to claim 13, wherein the primer is applied on the second side of the support by coating from an aqueous solution or a non-aqueous coating solution.

* * * * *